United States Patent
Lai et al.

(10) Patent No.: US 7,848,899 B2
(45) Date of Patent: Dec. 7, 2010

(54) SYSTEMS AND METHODS FOR TESTING INTEGRATED CIRCUIT DEVICES

(75) Inventors: Bosco Chun Sang Lai, Markham (CA);
Sunny Lai-Ming Chang, Markham (CA); Hong Liang Chan, Markham (CA); Yu Kuen Lam, Toronto (CA);
Lawrence Wai Cheung Ho, Mississauga (CA)

(73) Assignee: KingTiger Technology (Canada) Inc., Markham, Ontario (CA)

( * ) Notice: Subject to any disclaimer, the term of this patent is extended or adjusted under 35 U.S.C. 154(b) by 318 days.

(21) Appl. No.: 12/135,656

(22) Filed: Jun. 9, 2008

(65) Prior Publication Data

US 2009/0306925 A1      Dec. 10, 2009

(51) Int. Cl.
*G01R 31/00* (2006.01)

(52) U.S. Cl. .......................... 702/118; 714/25; 714/718; 714/734; 714/742; 702/117; 375/225; 370/241; 324/537

(58) Field of Classification Search .................. 324/765; 370/241; 375/225; 702/117, 118; 714/25, 714/718–719, 724, 733, 734, 736, 738, 742
See application file for complete search history.

(56) References Cited

U.S. PATENT DOCUMENTS

| | | | |
|---|---|---|---|
| 4,001,818 A | 1/1977 | Radichel et al. | |
| 4,379,259 A | 4/1983 | Varadi et al. | |
| 4,484,329 A | 11/1984 | Slamka et al. | |
| 4,821,238 A | 4/1989 | Tatematsu | |

(Continued)

FOREIGN PATENT DOCUMENTS

WO      WO 0229824      4/2002

OTHER PUBLICATIONS

Hermann A L, "Diagnostic Data Comparator", IBM Technical Disclosure Bulletin, IBM Corp. New York, US, vol. 24, No. 5, Oct. 1, 1981, pp. 2591-2592.

(Continued)

*Primary Examiner*—Mohamed Charioui
*Assistant Examiner*—Elias Desta
(74) *Attorney, Agent, or Firm*—Bereskin & Parr LLP/S.E.N.C.R.L., s.r.l

(57) ABSTRACT

Embodiments described herein relate to systems and methods for testing integrated circuit devices within an environment that is representative of the application environment in which an integrated circuit device will be used. In at least one embodiment, the testing system comprises a second reference integrated circuit device that provides flexibility in testing, allowing only the input to a first reference integrated circuit device of an application system to be tapped and not necessarily both input to and output from the first reference integrated circuit device to be tapped. In some embodiments, the input to the first reference integrated circuit device may be subsequently modified by a controller. The controller is configured to tap first test data transmitted to the first reference integrated circuit device of the application system, and transmit second test data to both the second reference integrated circuit device and at least one integrated circuit device under test, the second test data comprising at least a portion of the first test data. Reference response data received from the second reference integrated circuit device may then be compared with output from the at least one integrated circuit device under test.

28 Claims, 6 Drawing Sheets

U.S. PATENT DOCUMENTS

| | | | |
|---|---|---|---|
| 4,965,799 A | 10/1990 | Green et al. |
| 5,224,107 A | 6/1993 | Mattes |
| 5,375,228 A | 12/1994 | Leary et al. |
| 5,619,430 A | 4/1997 | Nolan et al. |
| 5,619,926 A | 4/1997 | Engelmann et al. |
| 5,720,031 A | 2/1998 | Lindsay |
| 5,794,175 A | 8/1998 | Conner |
| 5,844,913 A | 12/1998 | Hassoun et al. |
| 5,937,367 A | 8/1999 | Eckardt |
| 5,940,875 A | 8/1999 | Inagaki et al. |
| 5,959,914 A | 9/1999 | Gates et al. |
| 5,995,424 A | 11/1999 | Lawrence et al. |
| 5,995,915 A | 11/1999 | Reed et al. |
| 6,002,623 A | 12/1999 | Stave et al. |
| 6,014,759 A | 1/2000 | Manning |
| 6,018,484 A | 1/2000 | Brady |
| 6,029,262 A | 2/2000 | Medd et al. |
| 6,055,653 A | 4/2000 | LeBlanc et al. |
| 6,055,661 A | 4/2000 | Luk |
| 6,058,055 A | 5/2000 | Brunelle |
| 6,134,690 A | 10/2000 | Ivaturi et al. |
| 6,178,526 B1 | 1/2001 | Nguyen et al. |
| 6,275,962 B1 | 8/2001 | Fuller et al. |
| 6,313,657 B1 | 11/2001 | Hashimoto |
| 6,324,665 B1 | 11/2001 | Fay |
| 6,327,556 B1 * | 12/2001 | Geiger et al. ................ 703/13 |
| 6,345,372 B1 | 2/2002 | Dieckmann et al. |
| 6,389,525 B1 | 5/2002 | Reichert et al. |
| 6,425,095 B1 | 7/2002 | Yasui |
| 6,430,720 B1 | 8/2002 | Frey et al. |
| 6,452,411 B1 | 9/2002 | Miller et al. |
| 6,546,511 B1 | 4/2003 | Sim et al. |
| 6,574,759 B1 | 6/2003 | Woo et al. |
| 6,615,379 B1 | 9/2003 | Tripp et al. |
| 6,646,936 B2 | 11/2003 | Hamamatsu et al. |
| 6,701,474 B2 | 3/2004 | Cooke et al. |
| 6,731,125 B2 | 5/2004 | Chang |
| 6,754,117 B2 | 6/2004 | Jeddeloh |
| 6,851,076 B1 | 2/2005 | Cook, III et al. |
| 6,880,118 B2 | 4/2005 | Chen et al. |
| 6,888,366 B2 | 5/2005 | Kim et al. |
| 6,910,146 B2 * | 6/2005 | Dow ........................ 713/500 |
| 6,996,749 B1 | 2/2006 | Bains et al. |
| 7,085,980 B2 | 8/2006 | Martin-De-Nicolas et al. |
| 7,088,122 B2 | 8/2006 | Hartmann et al. |
| 7,092,902 B2 | 8/2006 | Eldridge et al. |
| 7,119,567 B2 | 10/2006 | Ma et al. |
| 7,131,046 B2 | 10/2006 | Volkerink et al. |
| 7,142,003 B2 | 11/2006 | Kanbayashi et al. |
| 2007/0140025 A1 | 6/2007 | Chan et al. |

OTHER PUBLICATIONS

U.S. Appl. No. 11/611,390, "Method and Apparatus for Testing a Fully Buffered Memory Module", filed Dec. 15, 2006 (Abandoned). (Retrievable from PAIR).

* cited by examiner

SYSTEMS AND METHODS FOR TESTING INTEGRATED CIRCUIT DEVICES

TECHNICAL FIELD

The described embodiments relate to systems and methods for testing integrated circuit devices. More particularly, the described embodiments relate to systems and methods for testing integrated circuit devices within an environment that is representative of the application environment (e.g. a personal computer) in which an integrated circuit device will be used.

BACKGROUND

Integrated circuit devices are typically subject to rigorous testing before they are sold or put to their intended use. In particular, each integrated circuit device is tested to determine whether or not certain specifications for that type of device, as determined and set by the manufacturer, are met.

Complete testing of an integrated circuit device may comprise both functional testing as well as application-specific testing. Functional testing generally tests whether or not the integrated circuit device performs particular functions properly and meets manufacturer's specifications. For example, if the integrated circuit device is or comprises a memory component such as a memory module or memory device, functional testing may test whether or not a digital value written to a cell of memory will later be retrieved without error, regardless of how the memory module or memory device is implemented.

Functional testing may also test whether or not certain critical operating characteristics of the integrated circuit device fall within an allowable range of values. These critical operating characteristics may include characteristics such as, for example, power consumption, standby current, leakage current, voltage levels and access time. The allowable range may equally be set by the manufacturer of the device or by corresponding appropriate standards.

While functional testing is generally oriented towards discovering whether or not an integrated circuit device under test is likely to fail during its intended use or application, it typically involves testing integrated circuit devices to verify how they execute a specific set of functions that are specially designed for this purpose.

One example of a known test system in which functional testing of integrated circuit devices is performed is described in U.S. Pat. No. 6,055,653 in the name of LeBlanc et al. Known test systems configured to perform functional testing typically comprise a test processor which generates test data and transmits the test data to both a reference integrated circuit device and one or more integrated circuit devices under test. The reference integrated circuit device and the integrated circuit devices under test each generate response data, in response to the test data. The response data generated by the reference integrated circuit device may be referred to as reference response data, whereas the response data generated by the integrated circuit devices under test may be referred to as test response data. The test response data for a given integrated circuit device under test is compared against the reference response data. If the data matches, then the given integrated circuit device may be considered to have produced valid data; otherwise, the given integrated circuit device may be considered to have undergone a failure of some kind.

Complete testing of an integrated circuit device may also involve application-specific testing. During application-specific testing, integrated circuit devices may be subject to a testing of their system behavior in order to detect their behavioral failures. Behavioral failure is a type of a failure that occurs when an integrated circuit device is operated within an actual application system. For example, a behavioral failure may be a failure that occurs as a result of a specific command or access sequence to a memory device or memory module that is performed in normal personal computer (PC) operations.

It is not necessarily the case that functional testing will detect behavioral failures. With functional testing, the operation of an integrated circuit device under test is not necessarily indicative of how the device will behave during its intended application. Accordingly, complete and comprehensive testing of an integrated circuit device may require application-specific testing in additional to functional testing.

One example of a known test system in which application-specific testing of integrated circuit devices is performed is described in U.S. patent application Ser. No. 09/678,397 in the name of Lai. Test systems configured to perform application-specific testing typically comprise an application system with an application processor and a reference integrated circuit device. The application processor runs an application task, and in operation, the processor sends commands to the reference integrated circuit device. In response to the commands, the reference integrated circuit device generates reference response data and sends it back to the processor. To facilitate testing of one or more integrated circuit devices under test, the communications lines between the processor and the reference integrated circuit device are tapped, so that a copy of the commands that were sent to the reference integrated circuit device is also sent to the integrated circuit devices under test, and so that a copy of the reference response data sent to the processor is also sent to a comparator. Each of the integrated circuit devices under test receives the same commands as the reference integrated circuit device, and generates test response data in response to the commands. The test response data generated by each integrated circuit device under test is sent to the comparator. The comparator then compares the reference response data with the test response data, and test results may be generated based on the comparisons. In particular, if the reference response data matches the test response data generated by a given integrated circuit device under test, then the integrated circuit device may be considered to have produced valid data; otherwise, the integrated circuit device may be considered to have undergone failure of some kind.

SUMMARY

Embodiments disclosed herein relate generally to systems and methods for testing integrated circuit devices.

In one broad aspect, there is provided a testing system for testing integrated circuit devices, the testing system comprising: a processor of an application system, wherein the processor is configured to perform an application task such that first test data is transmitted to a first reference integrated circuit device provided within the application system via at least one coupling between the processor and the first reference integrated circuit device; a first controller coupled to the at least one coupling, wherein the first controller is configured to tap the first test data transmitted via the at least one coupling, transmit second test data to a second reference integrated circuit device, wherein the second test data comprises at least a portion of the first test data, receive reference response data from the second reference integrated circuit device in response to the second test data transmitted thereto, transmit the second test data to at least one integrated circuit device under test, and transmit the reference response data to at least one comparator coupled to the at least one integrated circuit device under test; and the at least one comparator configured to receive the reference response data from the first controller, receive test response data generated by the at least one integrated circuit device under test in response to the second test data transmitted thereto, compare the reference response data to the test response data, and generate at least one test result from at least one comparison of the reference response data to the test response data.

In another broad aspect, there is provided a testing system for testing integrated circuit devices, the testing system comprising: a processor of an application system, wherein the processor is configured to perform an application task such that first test data is transmitted to a first reference integrated circuit device provided within the application system via at least one coupling between the processor and the first reference integrated circuit device, and first reference response data is generated by the first reference integrated circuit device and transmitted to the processor via the at least one coupling in response to the first test data transmitted to the first reference integrated circuit device; a first controller coupled to the at least one coupling, wherein the first controller is configured to tap the first test data and the first reference response data transmitted via the at least one coupling, identify a test mode from a value of a test configuration setting, wherein the test configuration setting is configurable to permit selection between at least two test modes of a group of test modes consisting of a first test mode, a second test mode and a third test mode, if the first test mode is identified, transmit the first test data to a second reference integrated circuit device, receive second reference response data from the second reference integrated circuit device in response to the first test data transmitted thereto, transmit the first test data to the at least one integrated circuit device under test, and transmit the second reference response data to the at least one comparator coupled to the at least one integrated circuit device under test, if the second mode is identified, generate additional test data, transmit second test data to the second reference integrated circuit device, wherein the second test data comprises at least a portion of the first test data and the additional test data, receive third reference response data from the second reference integrated circuit device in response to the second test data transmitted thereto, transmit the second test data to at least one integrated circuit device under test, and transmit the third reference response data to at least one comparator coupled to the at least one integrated circuit device under test, and if the third test mode is identified, transmit the first test data to the at least one integrated circuit device under test, and transmit the first reference response data to the at least one comparator coupled to the at least one integrated circuit device under test; and the at least one comparator configured to receive one of the first reference response data, the second reference response data, and the third reference response data from the first controller, receive test response data generated by the at least one integrated circuit device under test in response to one of the first test data and the second test data transmitted thereto, compare one of the first reference response data, the second reference response data and the third reference response data received from the first controller to the test response data, and generate at least one test result from at least one comparison of one of the first reference response data, the second reference response data and the third reference response data received from the first controller to the test response data.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

DETAILED DESCRIPTION

Figure 1:
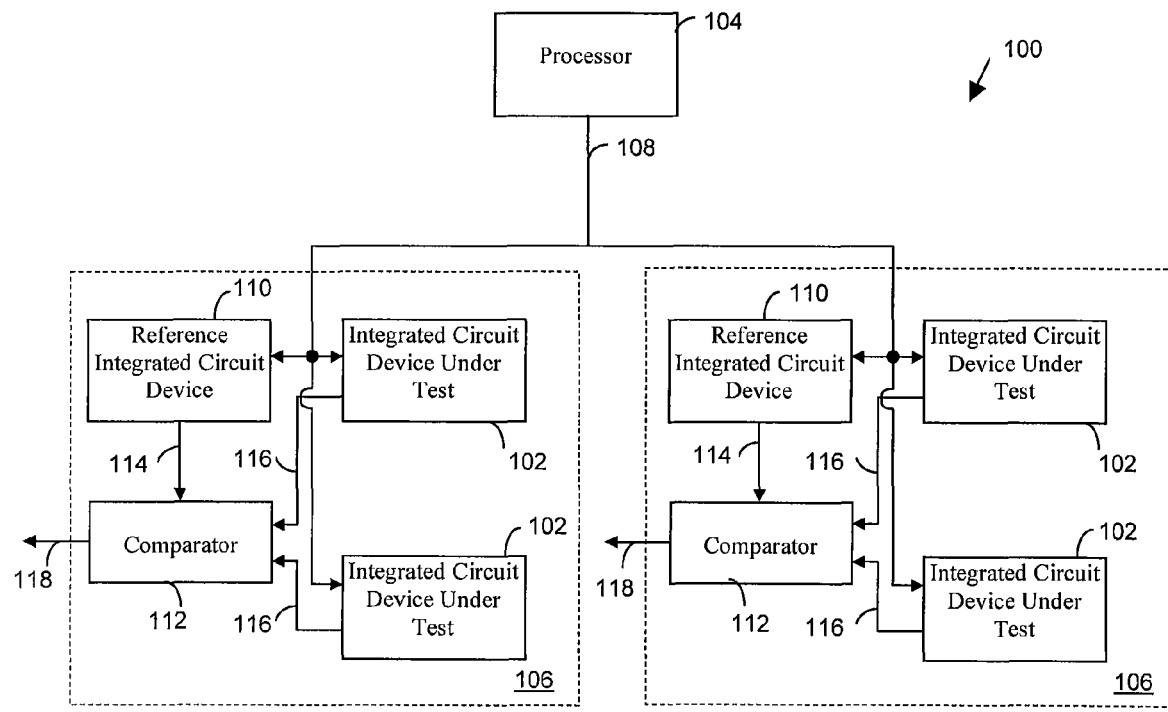
FIG. 1 is a block diagram of a known test system for performing functional testing of an integrated circuit device.

Reference is made to FIG. 1, in which a known test system 100 for performing functional testing of integrated circuit devices under test 102 is illustrated. The test system 100 comprises a processor 104 coupled to one or more testing modules 106 via a communications channel 108.

The processor 104 generates test data, which is transmitted to the testing modules 106 using the communications channel 108. Where the integrated circuit devices under test 102 are memory devices or memory modules, the test data may comprise test vector patterns to be used in testing the storage elements of the integrated circuit devices under test 102.

For example, the test patterns may correspond to instructions for performing the following operations on each of the integrated circuit devices under test 102:

Sample Test Algorithm
1) From the first to last memory address, write "0";
2) From the first to last memory address, read "0", write "1";
3) From the first to last memory address, read "1", write "0"
4) From the first to last memory address, read "0".

Each testing module 106 comprises one or more integrated circuit devices under test 102, a reference integrated circuit device 110 and a comparator 112. In the example shown in FIG. 1, each testing module 106 comprises two integrated circuit devices under test 102. The integrated circuit devices under test 102 may comprise memory devices, memory modules comprising more than one memory device, application-specific integrated circuit (ASIC) devices, ASIC modules comprising more than one ASIC device, or other integrated circuit devices. In a given test system, all of the integrated circuit devices under test 102 may be of the same type. The reference integrated circuit devices 110 are typically also of the same type as the integrated circuit devices under test 102, and will typically have already been thoroughly tested and confirmed as "good" devices.

After completion of testing, the integrated circuit devices under test 102 may be intended for use in computer systems that comprise a motherboard containing a processor and a chipset, which may comprise a controller (e.g. a memory controller for example). However, for functional testing purposes, the integrated circuit devices under test 102 are generally tested independently of other components of the computer systems.

Each of the integrated circuit devices under test 102 and the reference integrated circuit devices 110 receive the test data generated by the processor 104 via communications channel 108, and generate response data in response. The response data generated by the integrated circuit devices under test 102 may be more specifically referred to as test response data, whereas the response data generated by the reference integrated circuit devices 110 may be more specifically referred to as reference response data. The reference response data and the test response data are transmitted to the comparator 112 using communications channels 114 and 116 respectively.

The comparators 112 are configured to determine whether or not the test response data received from each of the integrated circuit devices under test 102 matches the reference response data generated by the corresponding reference integrated circuit device 110. The comparators 112 then output the results of comparisons on communications channel 118 as test results. If the comparator 112 determines a match between the test response data received from a particular integrated circuit device under test 102 and the reference response data, then the corresponding integrated circuit device under test 102 has, at least in the context of that particular test vector pattern, produced valid data. On the other hand, if the test response data received from a particular integrated circuit device under test 102 and the reference response data do not match, then the corresponding integrated circuit device under test 102 may have undergone a failure of some kind.

In functional testing, specific functionalities of integrated circuit devices under test are tested, generally using specially designed test procedures. In contrast, when application-specific tests are applied to an integrated circuit device under test, it is intended that the integrated circuit device under test be subject to the same system interactions as the integrated circuit device under test might be exposed to when it is eventually used in its intended application environment, in order to detect behavioral failures.

Figure 2:
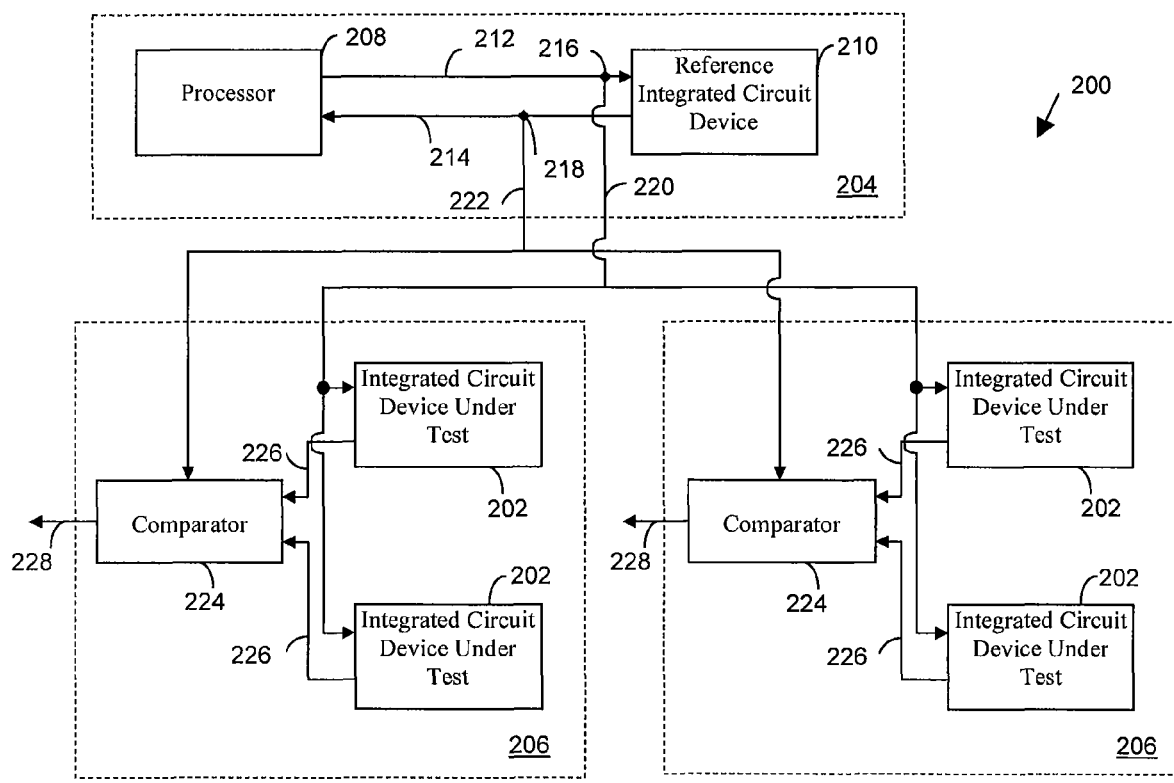
FIG. 2 is a block diagram of a known test system for performing application-specific testing of an integrated circuit device.

Reference is now made to FIG. 2, in which a known test system 200 for performing application-specific testing of integrated circuit devices under test 202 (e.g. memory devices) is illustrated. Test system 200 comprises an application system 204 coupled to one or more testing modules 206. In the example shown in FIG. 2, the test system 200 comprises two testing modules 206.

An application system may comprise a system, product, equipment or device that can use the integrated circuit devices under test 202. If the integrated circuit devices under test 202 are memory devices or a memory module comprised of a number of memory devices, the application system may comprise, for example, a PC, an appliance, a video card for a PC, a digital television (TV), an MP3 player, a camera, a voice recorder, a subassembly, a server, networking equipment, a cell phone, an information appliance, or other electronic product using memory devices or memory modules. The application system 204 may comprise hardware and software components, and may be "off-the-shelf" or custom-designed.

In the example shown in FIG. 2, the application system 204 comprises an application processor 208 coupled to a reference integrated circuit device 210 via a signal bus. The signal bus generally comprises one or more parallel wires, which are collectively used to transmit data signals generated by the application processor 208 to the reference integrated circuit device 210, and to transmit data signals generated by the reference integrated circuit device 210 back to the application processor 208. It will be understood that each of the wires of the signal bus may be either unidirectional or bidirectional. On wires that are unidirectional, data only flows in one direction, i.e. from the processor 208 to the reference integrated circuit device 210 or from the integrated circuit device 210 to the application processor 208. On wires that are bidirectional, data may flow in either direction.

For example, where the reference integrated circuit device 210 comprises double data rate synchronous dynamic random access memory (DDR SDRAM) devices, typically, the command and address wires are unidirectional and the data wires are bidirectional. However, it will be understood that the signal bus may generally comprise only unidirectional wires, only bidirectional wires, or some combination of both unidirectional and bidirectional wires.

To assist the reader in better understanding the embodiments described herein, the signal bus used to transmit data between the application processor 208 and the reference integrated circuit device 210 will be represented in the Figures (more specifically, FIGS. 2 to 4) logically as two individual communications channels 212 and 214. The first communication channel 212 represents one or more wires of the signal bus on which data signals are transmitted from the application processor 208 to the reference integrated circuit device 210. Put another way, the first communications channel 212 carries input to the reference integrated circuit device 210. In contrast, the second communications channel 214 represents one or more wires of the signal bus on which data signals are received by the processor 208 from the reference integrated circuit device 210. Put another way, the second communications channel 214 carries output generated by the reference integrated circuit device 210. Although the signal bus is represented in the Figures as two communications channels 212, 214 carrying input to and output from the reference integrated circuit device 210, the signal bus is physically implemented by a collective set of unidirectional and/or bidirectional wires as described above. Accordingly, it will be understood that a given bidirectional wire of the signal bus may be considered as belonging to the first communications channel 212 when transmitting data signals from the application processor 208 to the reference integrated circuit device 210, while the same bidirectional wire of the signal bus may be considered as belonging to the second communications channel 214 when transmitting data signals from the reference integrated circuit device 210 to the application processor 208.

It will be understood that the same logical representation of communications channels as represented in the Figures may also apply to other wires carrying input to and/or output from reference integrated circuit devices and/or integrated circuit devices under test.

During the normal course of operation of the application system 204, the application processor 208 executes an application task and generates data to be transmitted to the reference integrated circuit device 210, referred to herein generally as test data. The test data is transmitted from the application processor 208 to the reference integrated circuit device 210 using the first communications channel 212. In response to the test data received from the application processor 208, the reference integrated circuit device 210 generates reference response data. The reference response data is then transmitted from the reference integrated circuit device 210 back to the application processor 208 using the second communications channel 214.

To facilitate application-specific testing of integrated circuit devices under test 202 in test system 200, communications channels 212 and 214 (i.e. wires of the signal bus carrying input to and output from the reference integrated circuit device 210 respectively) are directly tapped using tapping connections 216 and 218 respectively. Typically, the tapping connection 216 taps the same number of wires as the number of wires that comprise the first communications channel 212, so that the test data transmitted via the first communications channel 212 is reproduced on the tapping connection 216. Similarly, tapping connection 218 typically taps the same number of wires as the number of wires that comprise the second communications channel 214, so that the reference response data transmitted via the second communications channel 214 is reproduced on the tapping connection 218. Tapping connections 216 and 218 are coupled to communications channels 220 and 222, which typically comprises the same number of wires as first communications channel 212 and second communications channel 214 respectively, to transfer the test data and the reference response data to the testing modules 206.

As previously described, some wires of communication channels 212 and 214 may be bidirectional in a physical implementation of the test system, and these bidirectional wires may be tapped using two physical tapping connections represented by tapping connections 216 and 218 in one implementation. However, in a variant implementation, the test system may comprise switches [not shown] that operate to cause only one of the tapping connections 216 or 218 to be open at any given time instant on the bidirectional wires.

Each testing module 206 comprises one or more integrated circuit devices under test 202 and a comparator 224. In the example shown in FIG. 2, each testing module 206 comprises two integrated circuit devices under test 202. The communications channel 220 is connected to the integrated circuit devices under test 202, and is used to direct a copy of the test data generated by the application processor 208 and sent to the reference integrated circuit device 210 within application system 204 to each of the integrated circuit devices under test 202. Accordingly, when test data is transmitted from the application processor 208 to the reference integrated circuit device 210, the test data will also be transmitted to the integrated circuit devices under test 202. For example, when the integrated circuit devices under test 202 comprise memory devices or memory modules, and the test data comprises a write command with accompanying data, data to be written to the reference integrated circuit device 210 will also be written to each of the integrated circuit devices under test 202.

Similarly, where the test data comprises a read command, the reference integrated circuit device 210 will output reference response data over channel 214 to be transmitted back to application processor 208. However, a copy of the reference response data is redirected to the comparators 224 using tapping connection 218 and communications channel 222. Since the integrated circuit devices under test 202 will receive the same read command as the reference integrated circuit device 210, each of the integrated circuit devices under test 202 will also output test response data in response to the read command. The test response data will be transferred from each of the integrated circuit devices under test 202 to the corresponding comparator 224 over the corresponding communications channel 226.

Each comparator 224 compares the test response data generated by the integrated circuit devices under test 202 to the reference response data generated by the reference integrated circuit device 210 and outputs test results for each integrated circuit device under test 202 on communications channel 228. If the comparator 224 determines a match between the test response data received from a particular integrated circuit device under test 202 and the reference response data, then the corresponding integrated circuit device under test 202 has, at least in the context of that particular test data, produced valid data. On the other hand, if the test response data received from a particular integrated circuit device under test 202 and the reference response data do not match, then the corresponding integrated circuit device under test 202 may have undergone a failure of some kind.

The reference integrated circuit device 210 acts as a reference device for the integrated circuit devices under test 202, as it is used to provide the expected response data for comparison with the response data generated by the integrated circuit devices under test 202. Therefore, the reference integrated circuit device 210 is typically a known "good", fully qualified integrated circuit device that is either the same type as the integrated circuit devices under test 202, or is functionally equivalent to the integrated circuit devices under test 202. For example, where the integrated circuit devices under test 202 comprise DDR SDRAM devices, then the reference integrated circuit device 210 typically comprises a known "good" DDR SDRAM device.

In test systems for performing application-specific testing of integrated circuit devices, such as test system 200, the integrated circuit devices under test 202 are advantageously exposed to the interactions between the application processor 208 and the reference integrated circuit device 210 of the application system 204 in a minimally obtrusive manner (e.g. by not directly replacing the reference integrated circuit device 210), so that the integrated circuit devices under test 202 are operated in a manner that closely simulates the environment in which they will likely be used.

It is generally desirable to design systems in which application-specific testing of integrated circuit devices is performed, so that the functions of the application system 204 are not affected by the quality of the integrated circuit devices under test 202, nor by the tapping connections that are made to facilitate the testing.

It will be understood that some wires carrying input data to and/or output data from either the reference integrated circuit devices or the integrated circuit devices under test can be shared in a physical implementation of a test system. For example, some wires of communications channels 220 and 226, for example, can be bidirectional in a physical implementation of the test system. Testing modules 206 may contain additional controllers [not shown] coupled to integrated circuit devices under test 202, which can be implemented in one or more standalone components. The functionality of the additional controllers may alternatively be integrated with one or more comparators 224.

Figure 3:
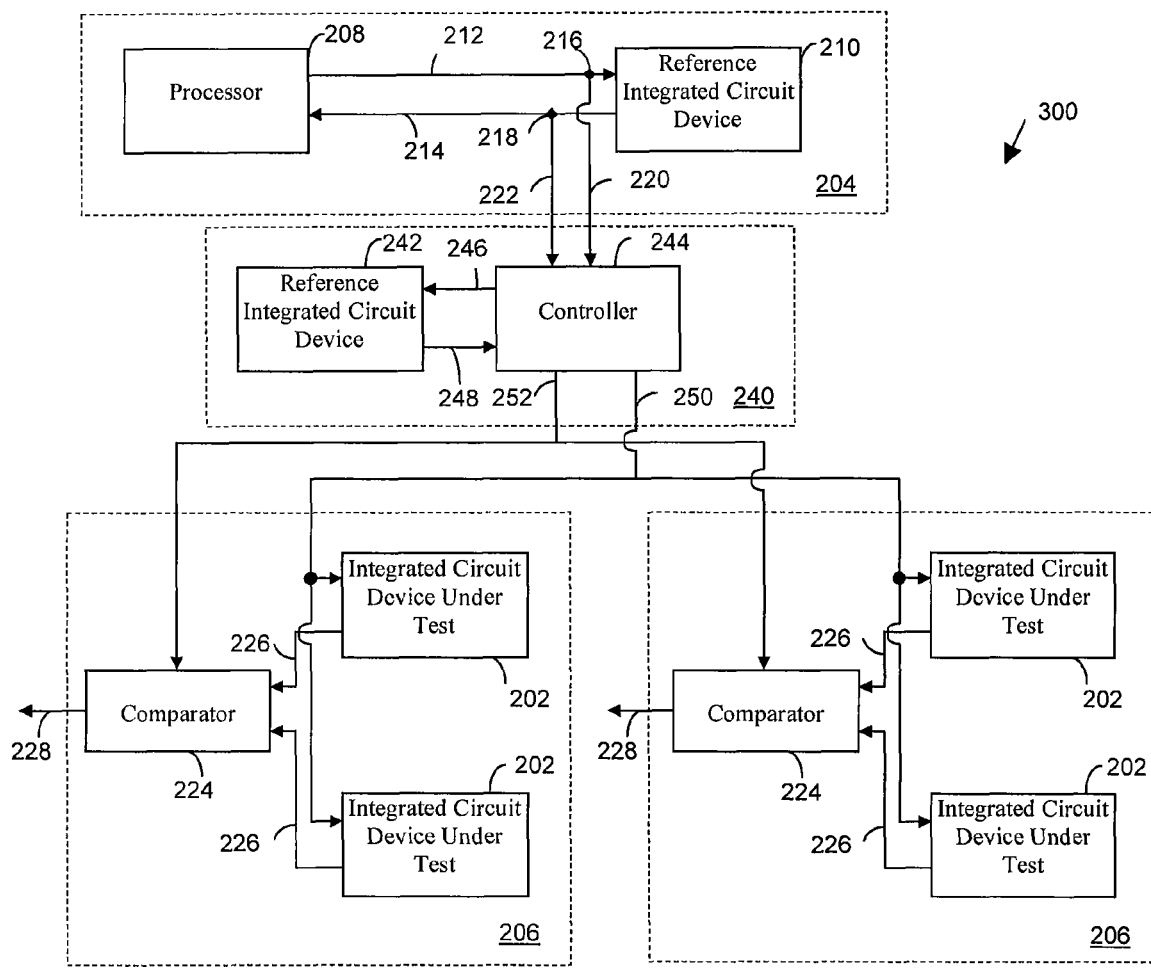
FIG. 3 is a block diagram of a test system for performing application-specific testing of an integrated circuit device in accordance with at least one embodiment.

Reference is now made to FIG. 3, in which a test system 300 for performing application-specific testing of integrated circuit devices 202 in accordance with at least one embodiment is illustrated. Test system 300 comprises an application system 204, a reference module 240 and one or more testing modules 206. In the example shown in FIG. 3, the test system 300 comprises two testing modules 206.

In the example shown in FIG. 3, the application system 204 comprises an application processor 208 coupled to a reference integrated circuit device 210 via a signal bus, represented logically by a first communications channel 212 and a second communications channel 214 as illustrated in FIG. 2, and as previously described with reference to FIG. 2.

In a manner similar to test system 200 of FIG. 2, during the normal course of operation of the application system 204 of test system 300, the application processor 208 executes an application task and generates data to be transmitted to the reference integrated circuit device 210, referred to herein generally as test data. The test data is transmitted from the application processor 208 to the reference integrated circuit device 210 using the first communications channel 212. In response to the test data received from the application processor 208, the reference integrated circuit device 210 generates reference response data. The reference response data is then transmitted from the reference integrated circuit device 210 back to the application processor 208 using the second communications channel 214.

To facilitate application-specific testing of integrated circuit devices under test 202, tapping connections to at least one communications channel within application system 204 are made.

In accordance with at least one embodiment, the first communications channel 212 is directly tapped using tapping connection 216. The tapping connection may tap the same number of wires as the number of wires that comprise the first communications channel 212, so that the test data transmitted via the first communications channel 212 is reproduced on the tapping connection 216. However, tapping connection 216 may alternatively have fewer wires than the number of wires that comprise the first communications channel 212. In general, while all of the test data transmitted via the first communications channel 212 may be tapped, it may be desirable to tap only some of the wires of the first communications channel 212 over which test data is transmitted.

For example, where the reference integrated circuit device 210 is a memory device and each of the wires of the first communications channel 212 corresponds to a specific data segment of the test data (e.g. command segment (e.g. read/write), address segment, and data segment), only those wires corresponding to the desired segments may be tapped. In one example embodiment, only the wires of the first communications channel 212 corresponding to the command segment of the test data are tapped using tapping connection 216.

Tapping connection 216 is coupled to communications channel 220 to transport a copy of the test data or the portion of the test data transmitted via the first communication channel 212 that is tapped by the tapping connection 216 to the reference module 240. In the example embodiments described herein, the components of reference module 240 reside outside of the application system 204.

In at least one variant embodiment, the second communications channel 214 in application system 204 is also tapped. In the example shown in FIG. 3, the second communications channel 214 is tapped using tapping connection 218. The tapping connection 218 may tap the same number of wires as the number of wires that comprise the second communications channel 214, so that the reference response data transmitted via the second communications channel 214 back to application processor 208 will be reproduced on the tapping connection 218. Tapping connection 218 is coupled to communications channel 222 to transport a copy of the reference response data to the reference module 240.

In embodiments where communications channel 214 is not tapped, tapping connection 218 and communications channel 222 as shown in FIG. 3 may, optionally, not be provided in system 300.

Use of reference module 240 may provide enhanced flexibility in comparison to known systems (e.g. system 200 of FIG. 2), in that both input (in whole or in part) to and output from reference integrated circuit device 210 of application system 204 may be tapped, or only the input (in whole or in part) to reference integrated circuit device 210 may be tapped. In some configurations, it may be desirable to only tap inputs to reference integrated circuit device 210. For example, it may be desirable to reduce the number of tapping connections made to communications channels within an application system 204. Furthermore, in some instances, it may be easier to implement system 300 by tapping only the input to reference integrated circuit device 210, rather than both the input to and output from reference integrated circuit device 210.

Referring again to FIG. 3, the reference module 240 comprises a second reference integrated circuit device 242 coupled to a controller 244 via at least one communications channel. In this example, communications channels 246 and 248 are illustrated. Communication channel 246 of reference module 240 represents a signal bus (e.g. comprising one or more parallel wires) used to transfer data from the controller 244 of reference module 240 to the second reference integrated circuit device 242. Communications channel 248 of reference module 240 represents a signal bus (e.g. comprising one or more parallel wires) used to transfer data from the second reference integrated circuit device 242 to the controller 244.

In some embodiments, some wires carrying input data to and/or output data from the second reference integrated circuit device 242 can be shared in a physical implementation of a test system. For example, some wires of communication channels 246 and 248 may be bidirectional in a physical implementation.

In one embodiment, the reference module 240 may operate in one of three example test modes. The mode in which reference module 240 is to operate may be determined based on a value of a test configuration setting. The test configuration setting may be configurable. For example, the value of the test configuration setting may be set and/or changed by a user (e.g. a test engineer), and test system 300 may provide a switch and/or a user interface [not shown] configured to facilitate such user configuration of the test configuration setting. The configuration setting may additionally, or alternatively, be controlled by a software application [not shown] coupled to test system 300, a hardware control [not shown], or some other means for automatically configuring the test configuration setting. In a variant embodiment, the reference module 240 may operate in any one of two pre-defined test modes of the three test modes described below. In a variant embodiment, reference module 240 may be configured to operate in only one pre-defined test mode of the three test modes described below, wherein the test mode is fixed and not determined based on a value of a test configuration setting. For greater certainty, system 300 may be configured to allow operation in one of the example test modes below, a combination of two example test modes below, or all three example test modes below in various embodiments.

In a first example test mode, the controller 244 receives a copy of the test data generated by the application processor 208 of application system 204 via communications channel 220, and re-transmits the test data to the second reference integrated circuit device 242 via communications channel 246. In response to the test data received from the controller 244, the second reference integrated circuit device 242 generates second reference response data. The second reference response data is transmitted from the second reference integrated circuit device 242 back to the controller 244 using the second communications channel 248. The controller 244 then transmits a copy of both the test data generated by the application processor 208 of application system 204 and the second reference response data generated by the second reference integrated circuit device 242 of reference module 240 to the testing modules 206, using communications channels 250 and 252 respectively. Accordingly, all input to reference integrated circuit device 210 of application system 204 and the output from second reference integrated circuit device 242 of reference module 240 are used to test the integrated circuit devices under test 202 in this example test mode.

In a second example test mode, the controller 244 receives a copy of the test data generated by the application processor 208 of application system 204, or a portion thereof, via communications channel 220 and generates additional test data.

The test data generated by application processor 208 of application system 204 may comprise a series of instructions (e.g. read and write instructions), with each instruction divided into multiple data structure segments. For example, where the integrated circuit devices under test 202 comprise memory devices, each instruction may comprise a command segment (e.g. read/write), an address segment and a data segment, where the command segment specifies whether the memory device is to read the data at, or write the data specified in the data segment to, the memory address specified in the address segment.

In some embodiments the command segment may support other instructions in addition to read and write. For example, where the integrated circuit devices 202 under test are DDR SDRAM devices, the command segment may comprise signals associated with one or more of the following instructions, provided as examples only: read, write, refresh, bank activate and pre-charge. In other embodiments, each instruction may further comprise a clock segment, for providing a clock signal.

In this example test mode, the controller 244 is configured to generate new test data using at least a portion of the test data obtained from the application system 204, and additional test data generated by controller 244. For example, the new test data may be generated using the data in one or more of a plurality of data structure segments of the test data generated by the application processor 208 of application system 204, or in a portion of the one or more data structure segments of the test data generated by the application processor 208 of application system 204. For example, the controller 244 may be configured to populate the command segments of the new test data with the data in the command segments of the test data generated by the application processor 208 of application system 204, and to populate the address and data segments of the new test data with additional test data generated by controller 244. Alternatively, the controller 244 may be configured to populate the command and address segments of the new test data with the data in the command and address segments of the test data generated by the application processor 208 of application system 204, and to only populate the data segments of the new test data with additional test data generated by controller 244. As a further example, where the command segment comprises signals representing multiple commands across a certain time interval, the controller 244 may be configured to only populate a portion of the command segment of the new test data with the portion of the command segment of the test data generated by the processor 208 of application system 204, while generating data to populate the remaining portions of command segment of the new test data.

In the foregoing examples, the new test data fails to provide a portion of the test data generated by the application processor 208 of application system 204; however, the additional test data generated by controller 244 comprises data that substitutes for the missing portion of the test data. The foregoing examples are provided by way of illustration only, and it will be understood that other combinations of test data generated by the application processor 208 of application system 204 and additional test data generated by controller 244 are possible in variant embodiments.

The ability of controller 244 to generate new test data may enhance application-specific testing of integrated circuit devices, since it allows the test system operator (e.g. test engineer) to configure the controller 244 to generate additional test data to substitute for certain data generated by the processor 208 of application system 204, when desired. This may provide greater flexibility as compared to known application-specific testing systems. For example, the system operator can configure the controller 244 to generate new test data that comprises instructions that would typically cause a failure in the application system 204. In accordance with at least one embodiment described herein, such new test data could be used to test integrated circuit devices under test 202 without crashing the application system 204.

Referring again to the second example test mode, once the new test data is generated by the controller 244, the new test data is transmitted to the second reference integrated circuit device 242 using the first communications channel 246. In response to the new test data received from the controller 244, the second reference integrated circuit device 242 generates second reference response data. The second reference integrated circuit device 242 transmits the second reference response data back to the controller 244 using the second communications channel 248. The controller 244 then transmits both the new test data generated by the controller 244 and the second reference response data generated by the second reference integrated circuit device 242 to the testing modules 206, using communications channels 250 and 252 respectively. Accordingly, in the second example test mode, some, but not all of the input to reference integrated circuit device 210 of application system 204 combined with additional test data generated by controller 244 of reference module 240, and the output from second reference integrated circuit device 242 of reference module 240 are used to test the integrated circuit devices under test 202.

In the first and second example test modes described above, it is not necessary that the second communications channel 214 of application system 204 be tapped using tapping connection 218, since the second reference response data received from the second reference integrated circuit device 242 of reference module 240 is used to test the integrated circuit devices under test 202. In the event that the tapping connection 218 and the communications channel 222 are provided in an implementation of test system 300 (e.g. if controller 244 is configured to operate in the third example test mode described below at the option of a test engineer), the reference response data generated by the reference integrated circuit device 210 of the application system 204 receivable thereon by controller 244 may be ignored in the first and second example test modes. In a variant embodiment, tapping connection 218 may be set inactive in the first and second example test modes using, for example, a switch [not shown].

In the third example test mode, which is operable only if communications channel 214 is tapped, using tapping connection 218 as shown in FIG. 3 by way of example, the controller 244 receives a copy of the test data generated by the application processor 208 of application system 204 and a copy of the reference response data generated by the reference integrated circuit device 210 of application system 204 via communications channels 220 and 222 respectively. The controller 244 then re-transmits a copy of the test data generated by the application processor 208 of application system 204 and the reference response data generated by the reference integrated circuit device 210 of application system 204 to the testing modules 206, using communications channels 250 and 252 respectively. Accordingly, both input to and output from reference integrated circuit device 210 of application system 204 are used to test the integrated circuit devices under test 202 in this example test mode.

Referring now to the testing modules 206 illustrated in FIG. 3, each testing module 206 comprises one or more integrated circuit devices under test 202 and a comparator 224. In the example shown in FIG. 3, each testing module 206 comprises two integrated circuit devices under test 202. In the example embodiments described herein, components of each testing module 206 reside outside of the application system 204. Typically, components of each testing module 206 will also reside outside of reference module 240.

Each integrated circuit device under test 202 receives the test data that is output by the controller 244 of the reference module 240, via communications channel 250. For example, when the reference module is operating in the first or third example test mode described above, the controller 244 outputs a copy of the test data generated by the application processor 208 of application system 204. However, when the reference module 240 is operating in the second example test mode described above, the controller 244 of the reference module 240 outputs the new test data generated partially by the controller 244. In response to the test data received from the controller 244, each integrated circuit device under test 202 generates test response data. The test response data is transmitted from each of the integrated circuit devices under test 202 to the corresponding comparator 224 using communications channel 226.

Each comparator 224 also receives reference response data from the controller 244 via communications channel 252. For example, when the reference module 240 is operating in the first or second example test mode described above, the controller 244 outputs the second reference response data generated by the second reference integrated circuit device 242 of reference module 240. However, when the reference module is operating in the third example test mode described above, the controller 244 outputs the reference response data generated by the reference integrated circuit device 210 of application system 204.

Each comparator 224 is configured to determine whether or not the test response data received from each of the integrated circuit devices under test 202 matches the reference response data generated by the reference integrated circuit device (e.g. reference integrated circuit device 210 of application system 204 under the third example test mode, or second reference integrated circuit device 242 of reference module 240 under the first or second example test mode). The comparators 224 then output the results of the comparisons on communications channel 228 as test results. If the comparator 224 determines a match between the test response data received from a particular integrated circuit device under test 202 and the reference response data, then the corresponding integrated circuit device under test 202 has, at least in the context of that particular test data, produced valid data. On the other hand, where the test response data received from a particular integrated circuit device under test 202 and the reference response data are not a match, then the corresponding integrated circuit device under test 202 may have undergone a failure of some kind.

The comparators 224 may comprise logic devices, such as a series of exclusive-or gates implemented using, for example, field programmable gate arrays (FPGA), application specific integrated circuits (ASIC) or other suitable components known by persons skilled in the art.

As similarly described previously in the present description, some wires carrying input data to and/or output data from integrated circuit devices under test can be shared in a physical implementation of a test system. For example, some wires of communication channels 250 and 226 may be bidirectional in a physical implementation. Testing modules 206 may comprise additional controllers [not shown] coupled to integrated circuit devices under test 202, which may be implemented in one or more standalone components. The functionality of the additional controllers may alternatively be integrated with one or more comparators 224.

Depending on the test mode being employed, either the first or the second reference integrated circuit device 210, 242 may act as a reference device for the integrated circuit devices under test 202, as each may be used to provide the expected response data for comparison with the response data generated by the integrated circuit devices under test 202. Therefore, both the first and second reference integrated circuit devices 210, 242 are typically known "good", fully qualified integrated circuit devices that are either the same type as the integrated circuit devices under test 202, or are functionally equivalent to the integrated circuit devices under test 202. For example, where the integrated circuit devices under test 202 comprise DDR SDRAM devices, then each of the first and second reference integrated circuit devices 210, 242 typically comprises known "good" DDR SDRAM devices.

The test results output on communications channel 228 may be collected by, for example, a microcontroller [not shown]. The microcontroller may subsequently provide the test result to an output device, an error logging unit, a separate application system, a microprocessor, a display, a set of light emitting diodes (LEDs), one or more error indicators (e.g. visual indicators, aural indicators, a combination of these), or an electronic component connected to one or more of these elements, for example.

Figure 4:
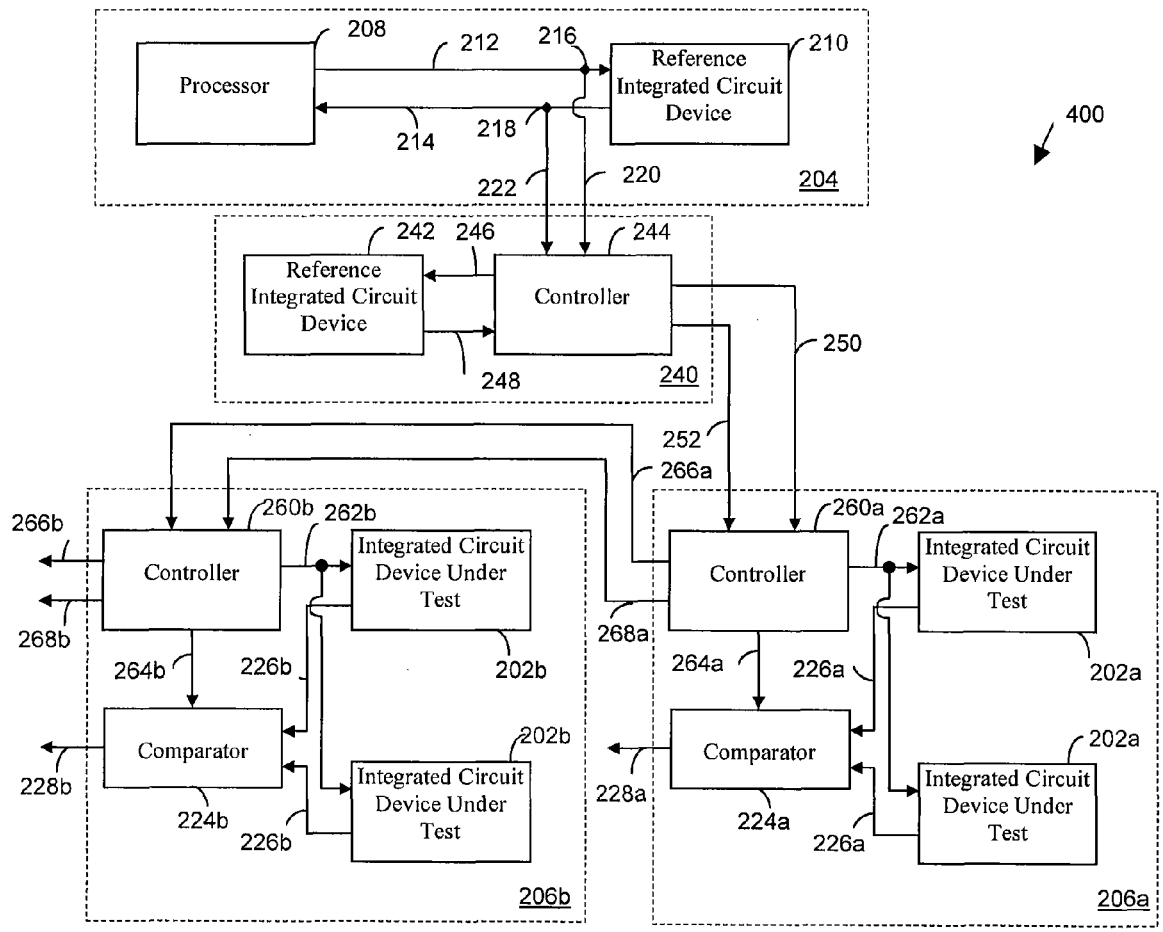
FIG. 4 is a block diagram of a test system for performing application-specific testing of an integrated circuit device in accordance with at least one other embodiment.

Reference is now made to FIG. 4, in which a test system 400 for performing application-specific testing of integrated circuit devices under test 202 in accordance with at least one other embodiment is illustrated. Test system 400 comprises an application system 204, a reference module 240 and one or more testing modules 206. In this example, the application system 204 and the reference module 240 of system 400 operate in the same manner and comprise the same components as their corresponding elements described with reference to the application system 204 and reference module 240 of test system 300 (FIG. 3) respectively. Accordingly, many of the components and functions of test system 400 have been previously described with reference to test system 300 of FIG. 3, and the reader is directed to the description of FIG. 3 for further details.

A primary difference between system 300 of FIG. 3 and test system 400 of FIG. 4 lies in the configuration of the testing modules 206 (indexed more specifically as 206a and 206b in FIG. 4). In test system 400, each testing module 206a, 206b comprises not only a comparator 224a, 224b and one or more integrated circuit devices under test 202a, 202b, but also a controller 260a, 260b associated with the respective testing module 206a, 206b. The addition of the controller 260a, 260b for each respective testing module 206a, 206b allows the testing modules 206a, 206b to be daisy-chained together, instead of all of the testing modules 206a, 206b being connected in parallel to the reference module 240 in a manner similar to testing modules 206 of test system 300. This configuration may reduce the length of the signal path for the test data and the reference response data being transmitted from controller 244 of reference module 240. This configuration may also allow for a reduction in the strength of the signals transmitted between the reference module 240 and the testing module(s). Specifically, since the signals transmitted from the reference module 240 to the testing module(s) are no longer distributed to multiple testing modules in parallel, but only to one testing module 206a, in this example, the strength of the signals may be reduced. The ability to accommodate a reduction in the strength of signals transmitted from the reference module 240 to the testing module(s) may be especially important in high-frequency environments. This configuration may also reduce costs associated with configuring the test system to accommodate parallel distribution of test data and reference response data by the controller 244 of reference module 240 to each testing module 206a, 206b simultaneously, although consideration might also need to be given to the relative expense of providing additional controllers in the "daisy-chain" configuration of the test system of FIG. 4.

As shown in FIG. 4, the controller 260a of a first testing module 206a is coupled directly to the controller 244 of the reference module 240 via communications channels 250 and 252. The controller 244 of the reference module 240 transmits test data to the controller 260a of the first testing module 206a via communications channel 250. For example, when the reference module 240 is operating in the first or third example test mode as previously described, the test data transmitted via communications channel 250 comprises the test data generated by the application processor 208. However, when the reference module 240 is operating in the second example test mode as previously described, the test data transmitted via communications channel 250 comprises the new test data generated by the controller 244.

Controller 244 of the reference module 240 also transmits reference response data to the controller 260a of the first testing module 206a, via communications channel 252. For example, when the reference module 240 is operating in the first or second example test mode as previously described, the reference response data transmitted via communications channel 252 comprises the reference response data generated by the second reference integrated circuit device 242 of the reference module 240. However, when the reference module 240 is operating in the third example test mode as previously described, the reference response data transmitted via communications channel 252 is the reference response data generated by the reference integrated circuit device 210 of application system 204.

The controller 260a of the first testing module 206a then transmits the test data received from the controller 244 of the reference module 240 to each of the integrated circuit devices under test 202a of the first testing module 206a using communications channel 262a. In response to the test data received from the controller 260a, each integrated circuit device under test 202a generates test response data. Test response data is transmitted from each integrated circuit device under test 202a of the first testing module 206a to a comparator 224a of the first testing module 206a using communications channel 226a.

As similarly described previously in the present description, some wires carrying input data to and/or output data from integrated circuit devices under test can be shared in a physical implementation of a test system. For example, some wires of communication channels 226a and 262a may be bidirectional in a physical implementation. Testing modules 206a may comprise additional controllers [not shown] coupled to integrated circuit devices under test 202a, which may be implemented in one or more standalone components. The functionality of the additional controllers may alternatively be integrated with one or more comparators 224a and/or controller 260a. Some or all of the functionality of one or more comparators 224a and controller 260a may be integrated in variant embodiments.

The comparator 224a of the first testing module 206a also receives the reference response data from the controller 260a via communications channel 264a. In a manner similarly described with reference to comparator 224 of FIG. 3, the comparator 224a of the first testing module 206a compares the test response data generated by each integrated circuit device under test 202a of the first testing module 206a against the reference response data received from the controller 260a to determine if there is a match.

Controller 260a may be connected to a controller in another testing module. In the example shown in FIG. 4, the controller 260b of a second testing module 206b is directly coupled to the controller 260a of the first testing module 206a via communications channels 266a and 268a. The controller 260b of the second testing module 206b receives test data from controller 260a of the first testing module 206a via communications channel 268a and reference response data from controller 260a of the first testing module 206a via communications channel 266a. In this example embodiment, the test data and reference response data received by controller 260b of the second testing module 206b from controller 260a of the first testing module 206a is the same as the test data and reference response data received by controller 260a of the first testing module 206a from the controller 244 of the reference module 240.

The controller 260b of the second testing module 206b transmits the test data received from controller 260a of the first testing module 206a to each of the integrated circuit devices under test 202b of the second testing module 206b using communications channel 262b. In response to the test data received from the controller 260b, each integrated circuit device under test 202b of the second testing module 206b generates test response data. Test response data is transmitted from each integrated circuit device under test 202b of the second testing module 206b to a comparator 224b of the second testing module 206b using communications channel 226b.

As similarly described previously in the present description, some wires carrying input data to and/or output data from integrated circuit devices under test can be shared in a physical implementation of a test system. For example, some wires of communication channels 226b and 262b may be bidirectional in a physical implementation. Testing module 206b may comprise additional controllers [not shown] coupled to integrated circuit devices under test 202b, which may be implemented in one or more standalone components. The functionality of the additional controllers may alternatively be integrated with one or more comparators 224b and/or controller 260b. Some or all of the functionality of one or more comparators 224b and controller 260b may be integrated in variant embodiments. It will be understood that similar features may be implemented in other daisy-chained testing modules not explicitly shown in FIG. 4.

The comparator 224b of the second testing module 206b also receives the reference response data from the controller 260b of the second testing module 206b via communications channel 264b. In a manner similarly described with reference to comparator 224a of the first testing module 206a, the comparator 224b of the second testing module 206b compares the test response data generated by each integrated circuit device under test 202b of the second testing module 206b against the reference response data received from the controller 260b to determine if there is a match.

A third testing module [not shown] may optionally be added to the test system 400 by coupling a controller [not shown] to the controller 260b of the second testing module 206b via communications channels 266b and 268b. A fourth testing module may optionally be coupled to the third testing module in a similar manner. It will be understood that additional testing modules may, optionally, be coupled in daisy-chain fashion in a similar manner.

Figure 5:
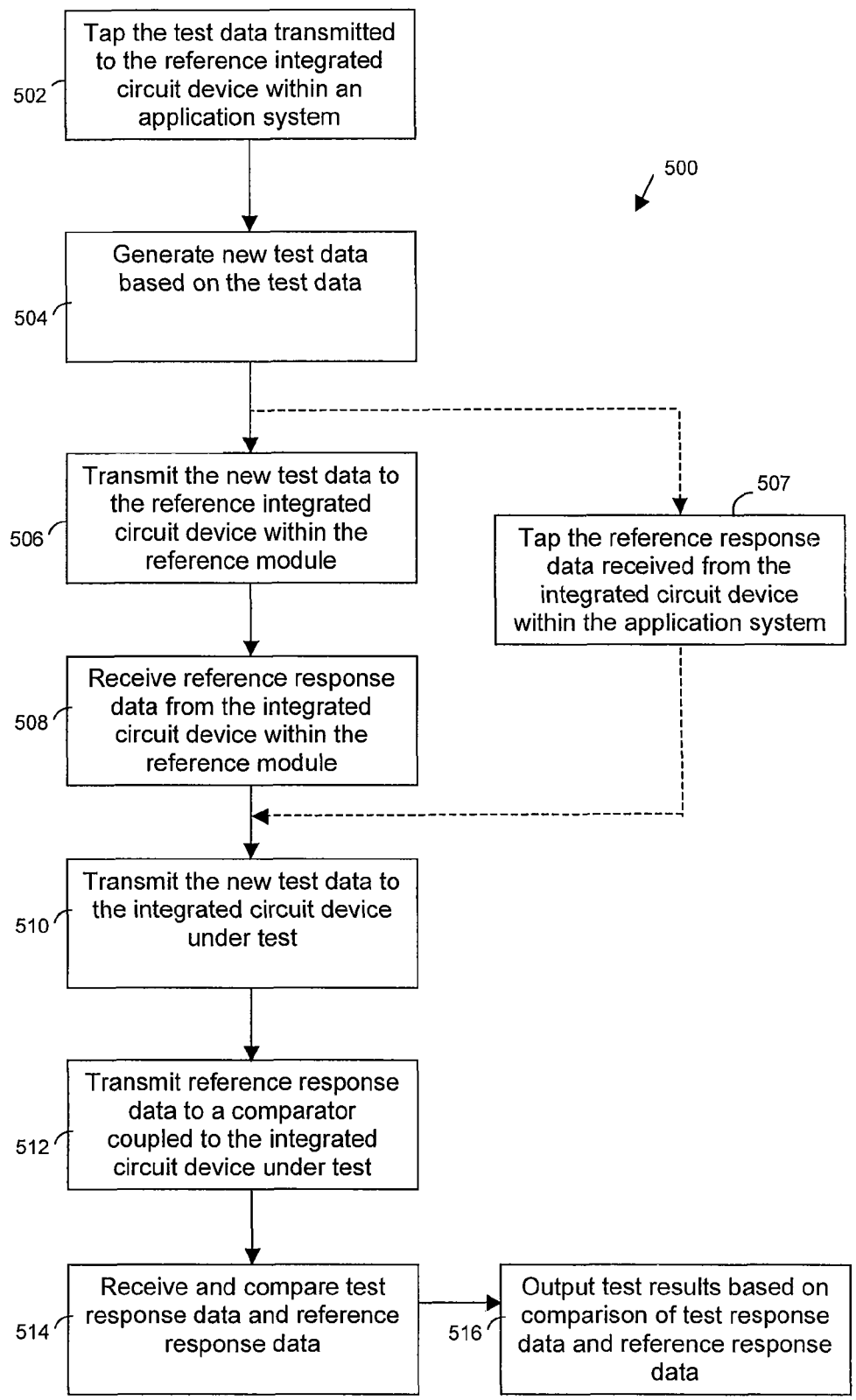
FIG. 5 is a flowchart illustrating acts performed in a method of testing an integrated circuit device in accordance with at least one example embodiment.

Reference is now made to FIG. 5, in which a flowchart illustrating acts performed in a method of testing integrated circuit devices in accordance with at least one embodiment is shown generally as 500. The integrated circuit devices under test (e.g. integrated circuit devices under test 202 of FIG. 3, integrated circuit devices under test 202a, 202b of FIG. 4) may comprise memory devices, memory modules comprising a plurality of memory devices, ASIC devices, ASIC modules comprising a plurality of ASIC devices, or other integrated circuit devices. Some of the features of the embodiments described herein may have been previously described in the present description (e.g. with reference to FIGS. 3 and 4).

At 502, a communications channel (e.g. first communications channel 212 of FIGS. 3 and 4) between an application processor (e.g. application processor 208 of FIGS. 3 and 4) and a reference integrated circuit device (e.g. reference integrated circuit device 210 of FIGS. 3 and 4) of an application system (e.g. application system 204 of FIGS. 3 and 4) is tapped to retrieve test data transmitted from the application processor to the reference integrated circuit device. The application processor and the reference integrated circuit device are part of an application system where the test data is generated by the application processor when the application processor executes an application task.

At 504, new test data is generated by a controller of a reference module (e.g. controller 244 of reference module 240 of FIGS. 3 and 4) from the test data retrieved by the tapping of the communications channel at 502. In at least one embodiment (e.g. the first or third example test modes previously described), the new test data is the same as the test data retrieved by the tapping of the communications channel at 502. In at least one other embodiment (e.g. the second example test mode previously described), the new test data contains only a portion of the test data retrieved by the tapping of the communications channel at 502 as well as additional test data generated by the controller. The test data generated by the processor of the application system may, for example, comprise a series of instructions, with each instruction divided into multiple data structure segments. For example, where the integrated circuit devices under test comprise memory devices, each instruction may comprise a command segment (e.g. read/write), an address segment and a data segment, where the command segment specifies whether the memory device is to read the data at, or write the data specified in the data segment to, the memory address specified in the address segment. In some embodiments, the command segment may support instructions other than read and write, as previously described.

The new test data may comprise, for example, only the command segments of the test data generated by the application processor in the application system, and additional test data generated by the controller to populate the address and data segments. In some embodiments, each instruction may further comprise a clock segment, for providing the value of a clock signal.

In some embodiments, the determination of whether the new test data is to be the same as the test data retrieved by the tapping of the communications channel at 502 or instead, whether the new test data is to comprise only a portion of the test data retrieved by the tapping of the communications channel at 502 and additional test data generated by the controller, may depend on an operational test mode of a reference module or the test system generally, which may be based on the value of a configurable test configuration setting. For example, where the method is implemented using test system 300 (FIG. 3) or test system 400 (FIG. 4), selection means such as a selection switch or an appropriately programmed user interface may be provided to allow a test engineer to select the desired test mode.

At 506, optionally, the new test data generated by the controller of the reference module is transmitted to a second reference integrated circuit device (e.g. second reference integrated circuit device 242 of FIGS. 3 and 4) of the reference module. In at least one embodiment, the components of the reference module (e.g. controller 244 and/or second reference integrated circuit device 242) reside outside of the application system. The second reference integrated circuit device acts as a reference device for the integrated circuit devices under test, as it is used to provide the expected response data for comparison with the response data generated by the integrated circuit devices under test. Therefore, the second reference integrated circuit device typically comprises a known "good", fully qualified integrated circuit device that is either the same type as the integrated circuit devices under test, or is functionally equivalent to the integrated circuit devices under test. Where new test data generated by the controller of the reference module is transmitted to a second reference integrated circuit device at 506 (e.g. in the first and second example test modes previously described), then at 508, reference response data is received from the second reference integrated circuit device in response to the new test data transmitted by the controller thereto at 506.

Alternatively (e.g. in the third example test mode previously described), at 507, reference response data is obtained by the controller of the reference module via a tapping of a communications channel (e.g. over second communications channel 214 of FIGS. 3 and 4) over which reference response data received from the reference integrated circuit device within the application system is transmitted.

At 510, the new test data generated by the controller of the reference module is transmitted to one or more integrated circuit devices under test (e.g. integrated circuit devices under test 202 of testing module 206 of FIG. 3 or 206a, 206b of FIG. 4). Accordingly, if the new test data was transmitted to the second reference integrated circuit device of the reference module (at 506), then both the second reference integrated circuit device and the integrated circuit devices under test will receive the same test data. For example, when the second reference integrated circuit device of the reference module and the integrated circuit devices under test comprise memory devices or memory modules, and if the new test data comprises a write command, then both the second reference integrated circuit device of the reference module and the integrated circuit devices under test will write the same data to memory.

In at least one embodiment, the components of each testing module (e.g. comparator 224 and/or integrated circuit devices under test 202 of FIG. 3; comparator 224a, 224b and/or controller 260a, 260b and/or integrated circuit devices under test 202a, 202b of FIG. 4) reside outside of the application system 204. Typically, the components of each testing module will also reside outside of the reference module.

The new test data generated by the controller of the reference module may be transmitted directly to the one or more integrated circuit devices under test (e.g. see FIG. 3), or indirectly via one or more additional controllers of the test system (e.g. see FIG. 4).

In operation, test response data is generated by each of the one or more integrated circuit devices under test in response to the new test data transmitted thereto.

At 512, reference response data is transmitted by the controller of the reference module to one or more comparators (e.g. comparator 224 of FIG. 3, comparators 224a, 224b of FIG. 4), each coupled to one or more integrated circuit devices under test. In at least one embodiment, the reference response data is that received from the second reference integrated circuit device of the reference module at 508 (e.g. in the first and second example test modes previously described). In at least one other embodiment (e.g. in the third example test mode previously described), the reference response data may be a tapped copy (e.g. obtained at 507) of the reference response data generated by the reference integrated circuit device of the application system (e.g. reference integrated circuit device 210 of the application system 204 of FIGS. 3 and 4).

The reference response data may be transmitted by the controller directly to the one or more comparators (e.g. see FIG. 3), or indirectly via one or more additional controllers of the test system (e.g. see FIG. 4).

At 514, each comparator receives the test response data from an integrated circuit device under test as well as reference response data from a controller of the test system (e.g. controller 244 of FIG. 3; controller 260a or 206b of FIG. 4), and compares the test response data with the reference response data to determine if there is a match. If the comparator determines a match between the test response data received from a particular integrated circuit device under test and the reference response data, then the corresponding integrated circuit device under test has, at least in the context of that particular test data, produced valid data. On the other hand, where the test response data received from a particular integrated circuit device under test and the reference response data do not match, then the corresponding integrated circuit device under test may have undergone a failure of some kind.

The acts of method 500 may be repeated to produce multiple test results, and the output at 516 may be provided only after multiple test results are obtained.

In a variant embodiment, the value of a test configuration setting may be set [act not shown] to identify the manner in which new test data and reference response data is to be generated, as previously described herein.

Figure 6A:
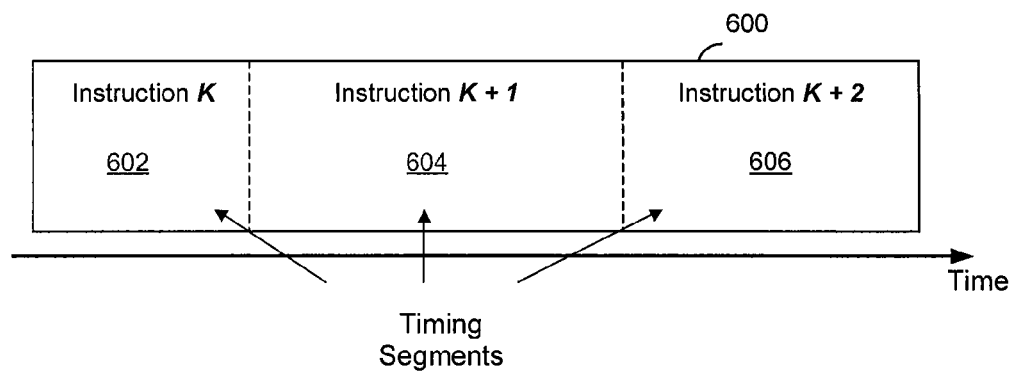
FIGS. 6a and 6b are schematic diagrams illustrating example structures of test data in accordance with at least one example embodiment.
Figure 6B:
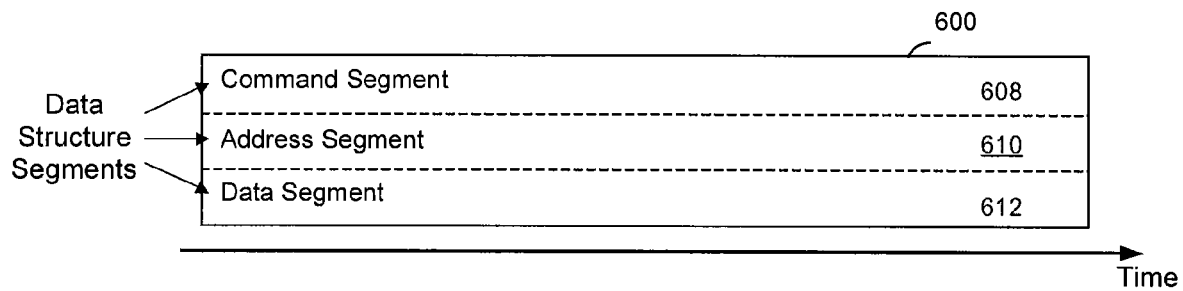

Referring now to FIGS. 6a and 6b, schematic diagrams illustrating example structures of test data in accordance with at least one example embodiment are shown.

In respect of the second example test mode previously described, the controller is configured to generate new test data using at least a portion of the test data obtained by tapping a signal bus of the application system, and additional test data generated by controller. As previously noted, the new test data may be generated by replacing the data in one or more of a plurality of data structure segments of the test data generated by the application processor of application system, or in a portion of the one or more data structure segments of the test data generated by the application processor of application system. By way of example, it was noted that the test data may be partitioned into a command segment, an address segment, and a data segment. However, in variant embodiments, the test data may be segmented in a different manner.

For instance, FIG. 6a shows that test data 600 may be partitioned into a plurality of consecutive instructions 602, 604, 606, etc. where each instruction occupies some timing segment (each of which may be of different time length). Accordingly, in respect of the second example test mode, certain selected instructions occupying different timing segments from the test data transmitted within the application system may be employed to test the integrated circuit devices under test, while the remaining instructions occupying corresponding timing segments may be populated using data generated by the controller and used to test the integrated circuit devices under test.

As a further example, FIG. 6b shows that the test data 600 may be partitioned into a plurality of data structure segments comprising a command segment 608, an address segment 610 and a data segment 612, as previously described. Accordingly, in respect of the second example test mode, certain selected data structure segments from the test data transmitted within the application system may be employed to test the integrated circuit devices under test, while the remaining data structure segments may be populated using data generated by the controller and used to test the integrated circuit devices under test.

In at least one variant embodiment, in respect of the second example test mode, a combination of partitioning into instructions occupying a number of timing segments (e.g. depicted by columns in FIG. 6a) and then further into data structure segments (e.g. depicted by rows in FIG. 6b) may be considered. For example, certain selected data structure segments from certain selected instructions of the test data transmitted within the application system may be employed to test the integrated circuit devices under test, while the remaining data structure segments and the remaining instructions may be populated using data generated by the controller and used to test the integrated circuit devices under test. It will be understood by persons skilled in the art that, in respect of the second example test mode, a combination of partitioning into data structure segments (e.g. depicted by rows in FIG. 6b) and then further into instructions occupying a number of timing segments (e.g. depicted by columns in FIG. 6a) may be considered, potentially providing the same result described with respect to the foregoing example.

It will be understood by persons skilled in the art that the functionality of certain components in the test systems described herein need not be provided by a single physical component, but may be provided by multiple components. For example, the functionality of a comparator may be provided by a single component or multiple electronic components. Similarly, the functionality of a controller may be provided by a single component or multiple electronic components.

It will further be understood by persons skilled in the art that the test systems described herein may comprise additional components (e.g. in the testing modules or reference module) that have not been explicitly described or illustrated in the Figures for ease of exposition. It will be understood that such components are not critical to the understanding of the embodiments described herein, but may be employed in a physical implementation thereof.

It will be further understood by persons skilled in the art that each of the test systems described herein may comprise additional synchronous and/or asynchronous delay elements, such as fixed-length or variable-length buffers, and/or other elements for the purposes of timing, either within a separate component in the test system or integrated within a device of the test systems (e.g. within a controller and/or a comparator), to ensure that the comparisons of test response data and reference response data are accurate.

It will be further understood by persons skilled in the art that although the test systems described herein, by way of illustration, depict all components of the reference module (e.g. reference module 240 of FIGS. 3 and 4) and of the testing modules (e.g. testing module 206 of FIG. 3, testing modules 206a, 206b of FIG. 4) as residing outside of the application system (e.g. application system 204 of FIGS. 3 and 4), one or more components of the reference module and/or of the testing modules may be provided within the application system in variant embodiments. Furthermore, one or more components of the reference module may be provided within the testing modules in variant embodiments.

As used herein, the wording "and/or" is intended to represent an inclusive-or. That is, "X and/or Y" is intended to mean X or Y or both. Moreover, "X, Y, and/or Z" is intended to mean X or Y or Z or any combination thereof.

The steps of a method of testing integrated circuit devices in accordance with any of the embodiments described herein may be provided as executable software instructions stored on computer-readable media.

The embodiments described herein have been shown and described by way of a number of examples. It will be apparent to those skilled in the art that changes and modifications to the described embodiments may be made without departing from the substance and scope of the described embodiments, as defined in the appended claims.

The invention claimed is:

1. A testing system for testing integrated circuit devices, the testing system comprising:
   a processor of an application system, wherein the processor is configured to perform an application task such that first test data is transmitted to a first reference integrated circuit device provided within the application system via at least one coupling between the processor and the first reference integrated circuit device;
   a first controller coupled to the at least one coupling, wherein the first controller is configured to
   tap the first test data transmitted via the at least one coupling,
   transmit second test data to a second reference integrated circuit device, wherein the second test data comprises at least a portion of the first test data,
   receive reference response data from the second reference integrated circuit device in response to the second test data transmitted thereto,
   transmit the second test data to at least one integrated circuit device under test, and
   transmit the reference response data to at least one comparator coupled to the at least one integrated circuit device under test; and
   the at least one comparator configured to
   receive the reference response data from the first controller,
   receive test response data generated by the at least one integrated circuit device under test in response to the second test data transmitted thereto,
   compare the reference response data to the test response data, and
   generate at least one test result from at least one comparison of the reference response data to the test response data.

2. The testing system of claim 1, wherein the second test data comprises all of the first test data.

3. The testing system of claim 1, wherein the first controller is further configured to generate additional test data; and wherein the second test data comprises at least a first portion of the first test data, and the additional test data.

4. The testing system of claim 3, wherein the second test data fails to provide a second portion of the first test data, and wherein the additional test data comprises data that substitutes for the second portion of the first test data.

5. The testing system of claim 4, wherein the first test data comprises a group of data structure segments, the group comprising a command segment, an address segment and a data segment; and wherein the additional test data comprises data that substitutes for at least a portion of at least one segment of the group.

6. The testing system of claim 5, wherein the additional test data comprises command data that substitutes for at least a portion of the command segment in the first test data.

7. The testing system of claim 5, wherein the group further comprises a clock segment.

8. The testing system of claim 4, wherein the additional test data to be generated by the first controller is identified based on a value of a test configuration setting.

9. The testing system of claim 1, wherein the at least one integrated circuit device under test resides outside of the application system.

10. The testing system of claim 9, wherein the at least one comparator coupled to the at least one integrated circuit device under test resides outside of the application system.

11. The testing system of claim 1, wherein the second reference integrated circuit device resides outside of the application system.

12. The testing system of claim 11, wherein the first controller resides outside of the application system.

13. The testing system of claim 1, further comprising:
   a second controller coupled to the first controller and the at least one comparator;
   wherein the first controller is configured to transmit, via the second controller, the second test data to the at least one integrated circuit device under test;
   wherein the first controller is configured to transmit, via the second controller, the reference response data to the at least one comparator coupled to the at least one integrated circuit device under test; and
   wherein the second controller is configured to
   receive the second test data and the reference response data from the first controller,
   transmit the reference response data to the at least one comparator, and
   transmit the second test data to the at least one integrated circuit device under test.

14. The testing system of claim 13, wherein the at least one integrated circuit device under test, the at least one comparator coupled thereto, and the second controller reside outside of the application system.

15. The testing system of claim 13, further comprising:
   a third controller coupled to the second controller and at least one additional comparator;
   wherein the second controller is further configured to transmit, via the third controller, the second test data to at least one additional integrated circuit device under test;
   wherein the second controller is further configured to transmit, via the third controller, the reference response data to the at least one additional comparator; and
   wherein the third controller is configured to
   receive the second test data and the reference response data from the second controller,
   transmit the reference response data to the at least one additional comparator, and
   transmit the second test data to the at least one additional integrated circuit device under test; and
   wherein the at least one additional comparator is configured to
   receive the reference response data from the third controller,
   receive second test response data generated by the at least one additional integrated circuit device under test in response to the second test data transmitted thereto,
   compare the reference response data to the second test response data, and generate at least one second test result from at least one comparison of the reference response data to the second test response data.

16. The testing system of claim 1, wherein the at least one integrated circuit device under test comprises a memory device.

17. The testing system of claim 1, wherein the at least one integrated circuit device under test comprises a memory module comprising a plurality of memory devices.

18. The testing system of claim 1, wherein the at least one integrated circuit device under test comprises an application-specific integrated circuit.

19. The testing system of claim 1, wherein the at least one integrated circuit device comprises a module comprising a plurality of application-specific integrated circuits.

20. A method for testing an integrated circuit device, the method comprising:
    a first controller tapping first test data transmitted to a first reference integrated circuit device provided within an application system in which an application task is performed by a processor of the application system;
    the first controller transmitting second test data to a second reference integrated circuit device, wherein the second test data comprises at least a portion of the first test data;
    the first controller receiving reference response data from the second reference integrated circuit device in response to the second test data transmitted thereto;
    the first controller transmitting the second test data to at least one integrated circuit device under test;
    the first controller transmitting the reference response data to at least one comparator coupled to the at least one integrated circuit device under test;
    the at least one comparator receiving the reference response data from the first controller;
    the at least one comparator receiving test response data generated by the at least one integrated circuit device under test in response to the second test data transmitted thereto;
    the at least one comparator comparing the reference response data to the test response data; and
    the at least one comparator generating at least one test result from at least one comparison of the reference response data to the test response data.

21. The method of claim 20, wherein the second test data comprises all of the first test data.

22. The method of claim 20, further comprising:
    the first controller generating additional test data;
    wherein the second test data comprises at least a first portion of the first test data, and the additional test data.

23. The method of claim 22, wherein the second test data fails to provide a second portion of the first test data, and wherein the additional test data comprises data that substitutes for the second portion of the first test data.

24. The method of claim 23, wherein the first test data comprises a group of data structure segments, the group comprising a command segment, an address segment and a data segment; and wherein the additional test data comprises data that substitutes for at least a portion of at least one segment of the group.

25. The method of claim 24, wherein the additional test data comprises command data that substitutes for at least a portion of the command segment in the first test data.

26. The method of claim 24, wherein the group further comprises a clock segment.

27. The method of claim 22, further comprising the first controller identifying the additional test data to be generated based on a value of a test configuration setting.

28. A testing system for testing integrated circuit devices, the testing system comprising:
    a processor of an application system, wherein the processor is configured
    to perform an application task such that
        first test data is transmitted to a first reference integrated circuit device provided within the application system via at least one coupling between the processor and the first reference integrated circuit device, and
        first reference response data is generated by the first reference integrated circuit device and transmitted to the processor via the at least one coupling in response to the first test data transmitted to the first reference integrated circuit device;
    a first controller coupled to the at least one coupling, wherein the first controller is configured to
        tap the first test data and the first reference response data transmitted via the at least one coupling,
        identify a test mode from a value of a test configuration setting, wherein the test configuration setting is configurable to permit selection between at least two test modes of a group of test modes consisting of a first test mode, a second test mode and a third test mode,
        if the first test mode is identified,
            transmit the first test data to a second reference integrated circuit device,
            receive second reference response data from the second reference integrated circuit device in response to the first test data transmitted thereto,
            transmit the first test data to the at least one integrated circuit device under test, and
            transmit the second reference response data to the at least one comparator coupled to the at least one integrated circuit device under test,
        if the second mode is identified,
            generate additional test data,
            transmit second test data to the second reference integrated circuit device, wherein the second test data comprises at least a portion of the first test data and the additional test data,
            receive third reference response data from the second reference integrated circuit device in response to the second test data transmitted thereto,
            transmit the second test data to at least one integrated circuit device under test, and
            transmit the third reference response data to at least one comparator coupled to the at least one integrated circuit device under test, and
        if the third test mode is identified,
            transmit the first test data to the at least one integrated circuit device under test, and
            transmit the first reference response data to the at least one comparator coupled to the at least one integrated circuit device under test; and
    the at least one comparator configured to
        receive one of the first reference response data, the second reference response data, and the third reference response data from the first controller, receive test response data generated by the at least one integrated circuit device under test in response to one of the first test data and the second test data transmitted thereto, compare one of the first reference response data, the second reference response data and the third reference response data received from the first controller to the test response data, and generate at least one test result from at least one comparison of one of the first reference response data, the second reference response data and the third reference response data received from the first controller to the test response data.

* * * * *